United States Patent
Knoll et al.

(10) Patent No.: US 6,546,059 B1
(45) Date of Patent: Apr. 8, 2003

(54) ADAPTIVE INTEGRATED PLL LOOP FILTER

(75) Inventors: Ernest Knoll, Haifa (IL); Eyal Fayneh, Givataym (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,585

(22) Filed: Dec. 28, 1999

(51) Int. Cl.[7] .............................................. H04L 25/49
(52) U.S. Cl. ..................... 375/294; 375/327; 375/376; 327/148; 327/157; 327/554; 327/561; 331/36 R
(58) Field of Search ................................. 375/215, 294, 375/327, 373–376; 327/147, 148, 156, 157, 552, 554, 560, 561; 331/17, 25, 36 R, 36 C

(56) References Cited

U.S. PATENT DOCUMENTS

| | | | | | |
|---|---|---|---|---|---|
| 4,524,333 A | * | 6/1985 | Iwata et al. | ................. | 327/156 |
| 4,682,116 A | * | 7/1987 | Wolaver et al. | ............. | 327/336 |
| 5,021,749 A | * | 6/1991 | Kasai et al. | ................. | 327/554 |
| 5,170,130 A | * | 12/1992 | Ichihara | ..................... | 327/157 |
| 5,382,918 A | * | 1/1995 | Yamatake | ................... | 330/260 |
| 5,479,126 A | * | 12/1995 | Pan et al. | .................... | 327/148 |
| 6,057,739 A | * | 5/2000 | Crowley et al. | .............. | 331/14 |
| 6,344,772 B1 | * | 2/2002 | Larsson | ..................... | 327/552 |
| 6,389,092 B1 | * | 5/2002 | Momtaz | ..................... | 327/157 |

* cited by examiner

*Primary Examiner*—Stephen Chin
*Assistant Examiner*—Dac V. Ha
(74) *Attorney, Agent, or Firm*—Fish & Richardson P.C.

(57) ABSTRACT

A loop filter in the phase-locked loop includes a capacitor having a specific capacitance value. The loop filter also includes an amplifier coupled to a node of the capacitor. The amplifier amplifies a signal at the node in a way that increases the equivalent capacitance value without physically changing the capacitor.

6 Claims, 5 Drawing Sheets

ADAPTIVE INTEGRATED PLL LOOP FILTER

BACKGROUND

This disclosure relates to phase-locked loops and more specifically, to a loop filter used in a phase-locked loop.

A phase-locked loop (PLL) is often used in designing a precise clock for a system. The PLL takes advantage of negative feedback to constantly adjust the frequency and phase of an oscillator that may change or drift. FIG. 1 is a simplified block diagram of the PLL. The PLL includes a voltage-controlled oscillator (VCO) 100, a phase and frequency detector 102, and a feedback frequency divider 104. The VCO 100 often takes a voltage 106 as its control input and outputs a signal 108 whose frequency is based on the value of the input voltage 106. The phase and frequency detector 102 operates in reverse. It takes two signals 109, 110 as its inputs and outputs a voltage 106 based on the difference between the frequencies of the two signals 109, 110.

A PLL in a computer system, for example, receives a reference frequency source 110, such as an external bus clock, and a feedback frequency 109 from the VCO as inputs to the phase and frequency detector 102. The feedback signal 109 frequency is the VCO output frequency divided by the feedback frequency divider 104. The output from the phase and frequency detector 102 is then used to control the VCO 100. When the PLL is locked, the frequency and phase of the reference signal 110 and of the feedback signal 109 are equal. The VCO output 108 frequency is N times the frequency of the reference signal 110 (N is the dividing ratio of the feedback frequency divider 104). If the VCO 100 starts to drift, the phase and frequency detector 102 detects and corrects the discrepancy.

The output of the PLL circuit can then be used to clock a processor, such as a central processing unit (CPU). Due to the feedback frequency divider 104, the CPU clock has a significantly higher frequency than the bus clock.

In a preferred design for the PLL, charge pumps and a loop filter are coupled between the frequency comparator 102 and the VCO 100 to control the VCO output frequency. The charge pumps feed pulses of current to a capacitor in the loop filter. The current pulse charges and discharges the loop filter capacitor.

SUMMARY

A loop filter in the phase-locked loop includes a capacitor having a first capacitance. The loop filter also includes an amplifier coupled to a node of the capacitor. The amplifier amplifies a signal at the node in a way that increases the first capacitance without physically changing the capacitor.

BRIEF DESCRIPTION OF THE DRAWINGS

Different aspects of the disclosure will be described in reference to the accompanying drawings wherein.

DETAILED DESCRIPTION

Figure 1:
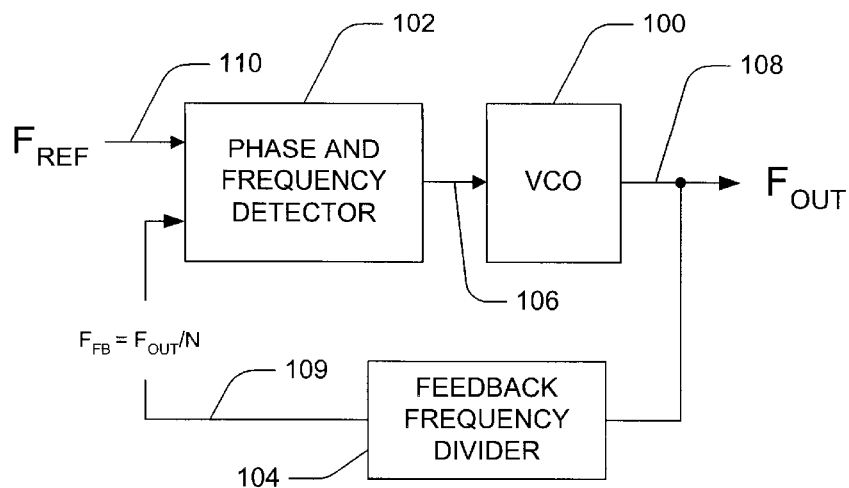
FIG. 1 is a simplified block diagram of a phase-locked loop (PLL)
Figure 2:
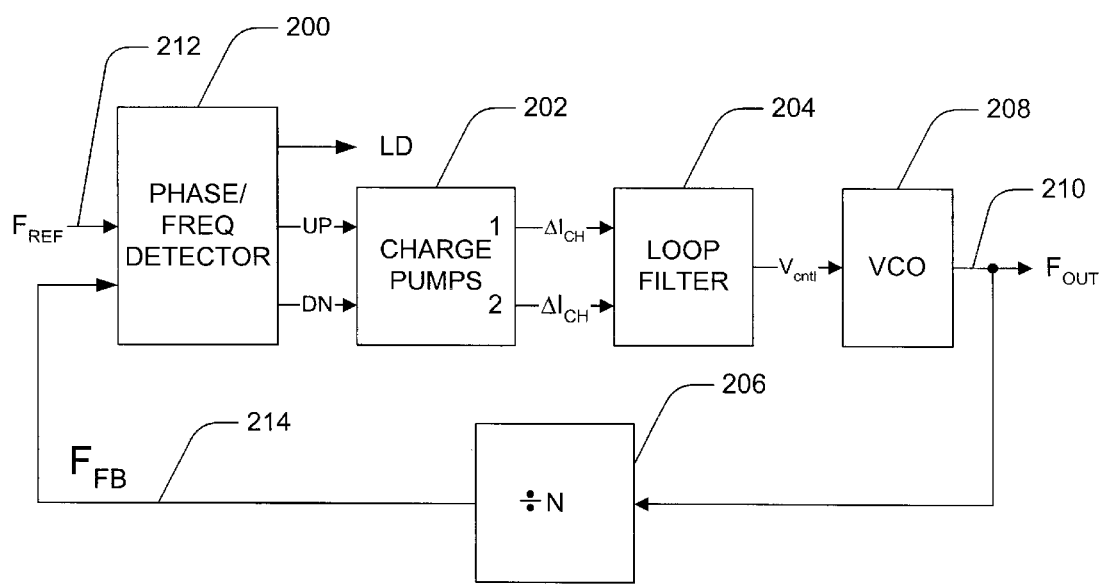
FIG. 2 is a block diagram of the PLL that includes a loop filter.

A phase-locked loop (PLL) circuit, shown in FIG. 2, includes a phase detector 200, one or more charge pumps 202, a loop filter 204, a divide-by-N frequency divider 206, and a voltage-controlled oscillator (VCO) 208. The frequency divider 206 is attached to the feedback loop. The divider 206 allows the PLL output frequency to be N times the reference frequency. Therefore, the VCO 208 is tuned by the PLL to be an N-multiple of the reference frequency.

Figure 3:
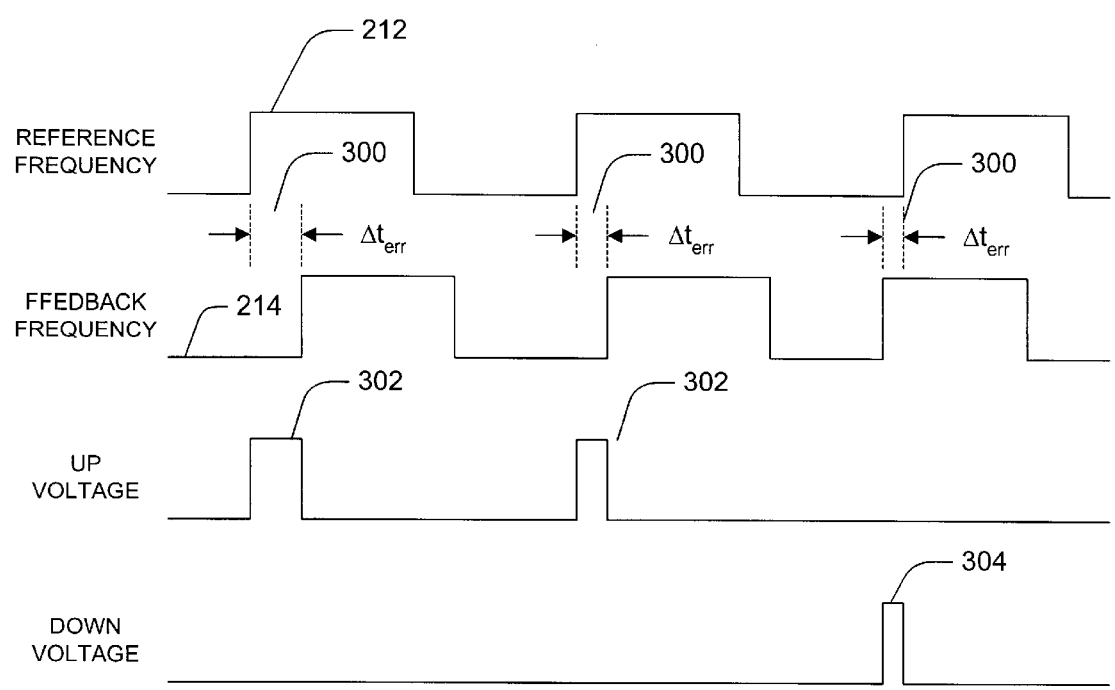
FIG. 3 shows timing diagrams of output signals from a phase detector.

A phase detector 200 is a digital, edge-sensitive comparator. The phase detector 200 receives two signals, a reference frequency and a feedback frequency (frequency divided VCO output). The detector 200 measures the phase or frequency offset between the two signals, which is equivalent to a time skew ($\Delta T_{err}$) 300 in FIG. 3. The phase detector 200 outputs two voltages, UP and DOWN voltages. The UP voltage pulses logic high, at 302, when the VCO output 210 lags behind the reference input 212 in phase or frequency. The DOWN voltage pulses logic high when the VCO output leads the reference input in phase or frequency. The UP and DOWN voltage pulses are converted to current pulses by the charge pumps 202.

Figure 4:
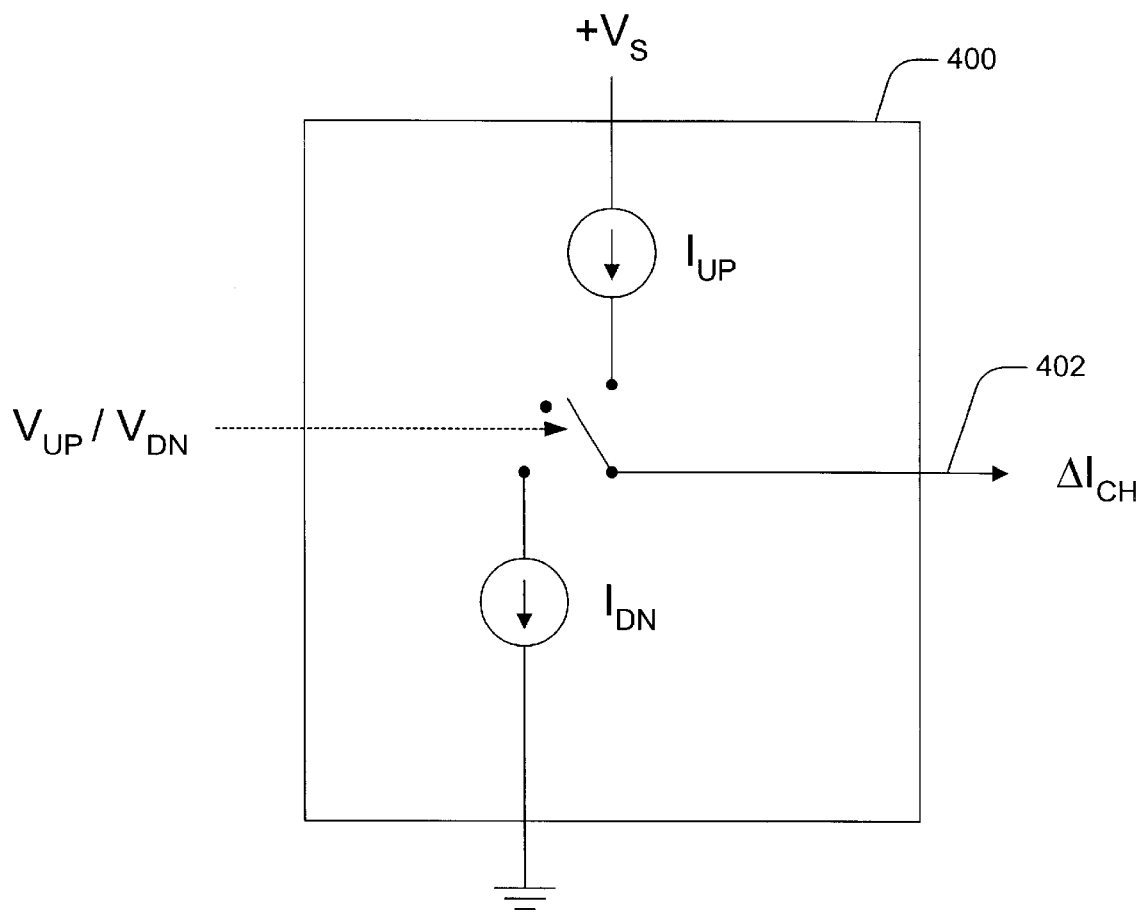
FIG. 4 is a simplified schematic diagram of a charge pump.

A charge pump 400, shown in FIG. 4, is a tri-state switch designed to charge and discharge a capacitor in the loop filter 204. The charge pump 400 feeds pulses of current ($\Delta I_{CH}$) 402 to the capacitor in response to UP and DOWN voltage pulses. The capacitor is charged when the UP voltage is pulsed logic high and is discharged when the DOWN voltage is pulsed logic high. The duration of the current pulse is proportional to the phase error or time skew ($\Delta T_{err}$) 300.

The loop filter 204 is a low-pass filter that filters an error signal coming from the phase detector 200. The filter 204 converts the current pulses at the output of the charge pump 400 to a VCO control voltage. This results in an output voltage of the loop filter 204 that rises or falls depending on the direction of the phase or frequency difference. The filter 204 is designed to correctly set the bandwidth and the damping factor of the PLL. The resultant output voltage ($V_{cntl}$) controls the VCO 208 by increasing or decreasing the output frequency 210.

Figure 5:
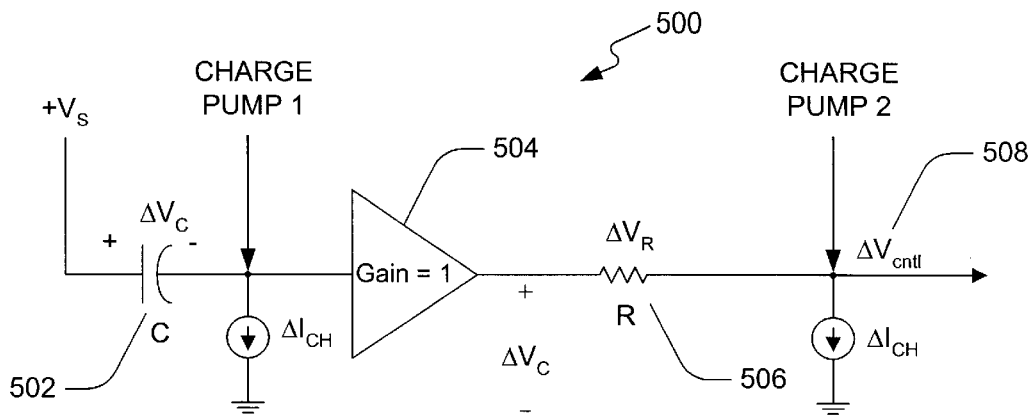
FIG. 5 is a simplified schematic diagram of a conventional loop filter.

FIG. 5 shows a simplified schematic diagram of a conventional integrated loop filter 500. Two identical charge pumps 202 drive the filter 500. The first pump drives the loop filter capacitor C. A voltage, $\Delta V_c$ developed on the capacitor 502 is represented by equation:

$$\Delta V_C = \frac{1}{C} \cdot \Delta I_{CH} \cdot \Delta t_{err}, \qquad [1]$$

where $\Delta t_{err}$ is the instantaneous phase error and $\Delta I_{CH}$ is the charge current provided by the first charge pump.

When the capacitor 502 is charged, a unity gain amplifier 504 is used as a buffer to repeat the capacitor voltage to its output. The second charge pump drives the loop filter resistor R. Thus, a voltage drop across the loop filter resistor 506 is:

$$\Delta V_R = R \cdot \Delta I_{CH}. \qquad [2]$$

A resultant VCO control voltage 508 is:

$$\Delta V_{cntl} = \Delta V_C + \Delta V_R = \left(\frac{\Delta t_{err}}{C} + R\right) \cdot \Delta I_{CH}. \qquad [3]$$

Therefore, the control voltage 508 is a function of the loop filter capacitor 502 and resistor 506, the time skew ($\Delta T_{err}$) between the reference frequency and the feedback frequency, and the charge pump current ($\Delta I_{CH}$).

Disadvantages of having the control voltage 508 depend on the loop filter capacitor 502 include the capacitor 502 occupying a large portion of the physical area of the PLL. In some embodiments, the loop filter capacitor 502 is approximately 200 to 1000 pico-Farads. The capacitance area can occupy approximately 40% to 70% of the PLL area. Furthermore, the next generation PLLs may require even larger percentages of the PLL area. In other embodiments, a large loop filter capacitor 502, on the order of about few hundred pico-Farads, also causes high leakage current. An increase in the leakage current may cause other performance and functional degradations, such as ripples on the VCO control voltage 508. The ripples, in turn, cause jitters on the VCO frequency.

Figure 6:
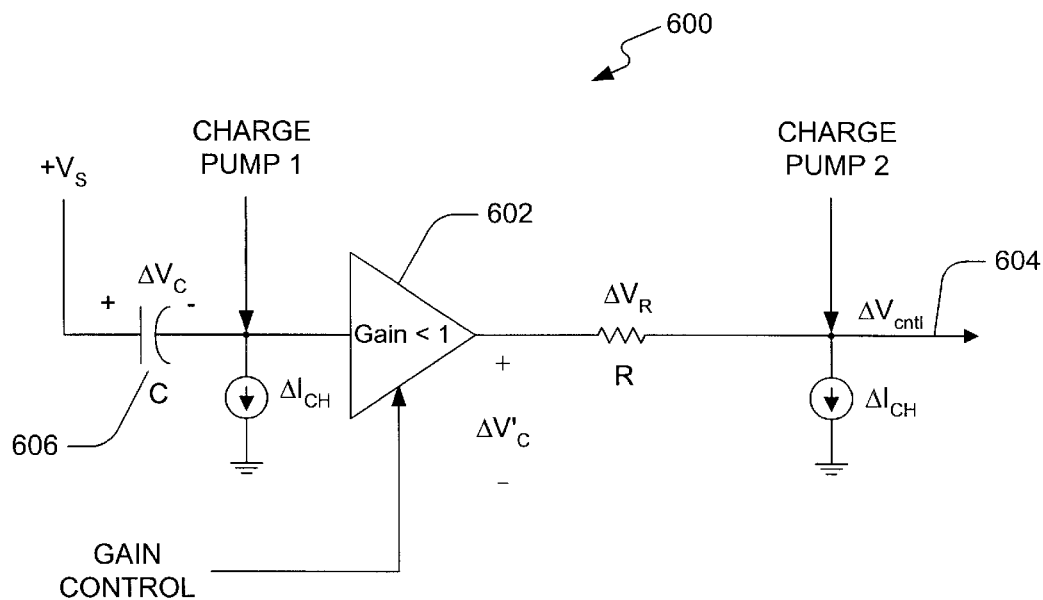
FIG. 6 is a simplified schematic diagram of an adaptive integrated loop filter.

A simplified schematic diagram of the adaptive integrated loop filter 600 according an embodiment of the present invention, shown in FIG. 6, addresses some of the above-described disadvantages. In the modified design 600, the gain of the amplifier 602 can be controlled. The voltage at the output of the amplifier 602 is changed to:

$$\Delta V_C' = g \cdot \Delta V_C = \frac{g}{C} \cdot \Delta I_{CH} \cdot \Delta t_{err}. \qquad [4]$$

The VCO control voltage 604 is changed to:

$$\Delta V_{cntl} = \Delta V_C + \Delta V_R = \left(\frac{\Delta t_{err} \cdot g}{C} + R\right) \cdot \Delta I_{CH}. \qquad [5]$$

In one embodiment, the gain of the amplifier 602, g, is adjusted to be less than one. Accordingly, the capacitance gain has the effect of increasing the value of the loop filter capacitor 606, in equations [4] and [5], without physically changing the capacitor value. The effective capacitance becomes kC, where k=1/g. Since g is less than one, k is more than one. Therefore, the effective capacitance kC is larger than C.

For example, if the amplifier gain is set to 0.5, the effective capacitance value is doubled to 2C. Thus, in on embodiment, approximately 50% of the physical area can be saved with a same capacitor value as compared to the conventional amplifier. For such an example, the loop filter 600 may occupy only about 20% to 35% of the PLL physical area instead of the 40% to 70% occupied by the fixed unity gain amplifier 504. Further, by allowing the gain of the amplifier 602 to be controllable, the PLL parameters, such as a damping factor and loop bandwidth can be easily adjusted. For example, the loop bandwidth and damping factor are affected by the feedback frequency dividing factor N. When N is set (in order to set the CPU clock frequency), the gain of the amplifier 602 is also set to obtain the desired values for loop bandwidth and dumping factor.

Figure 7:
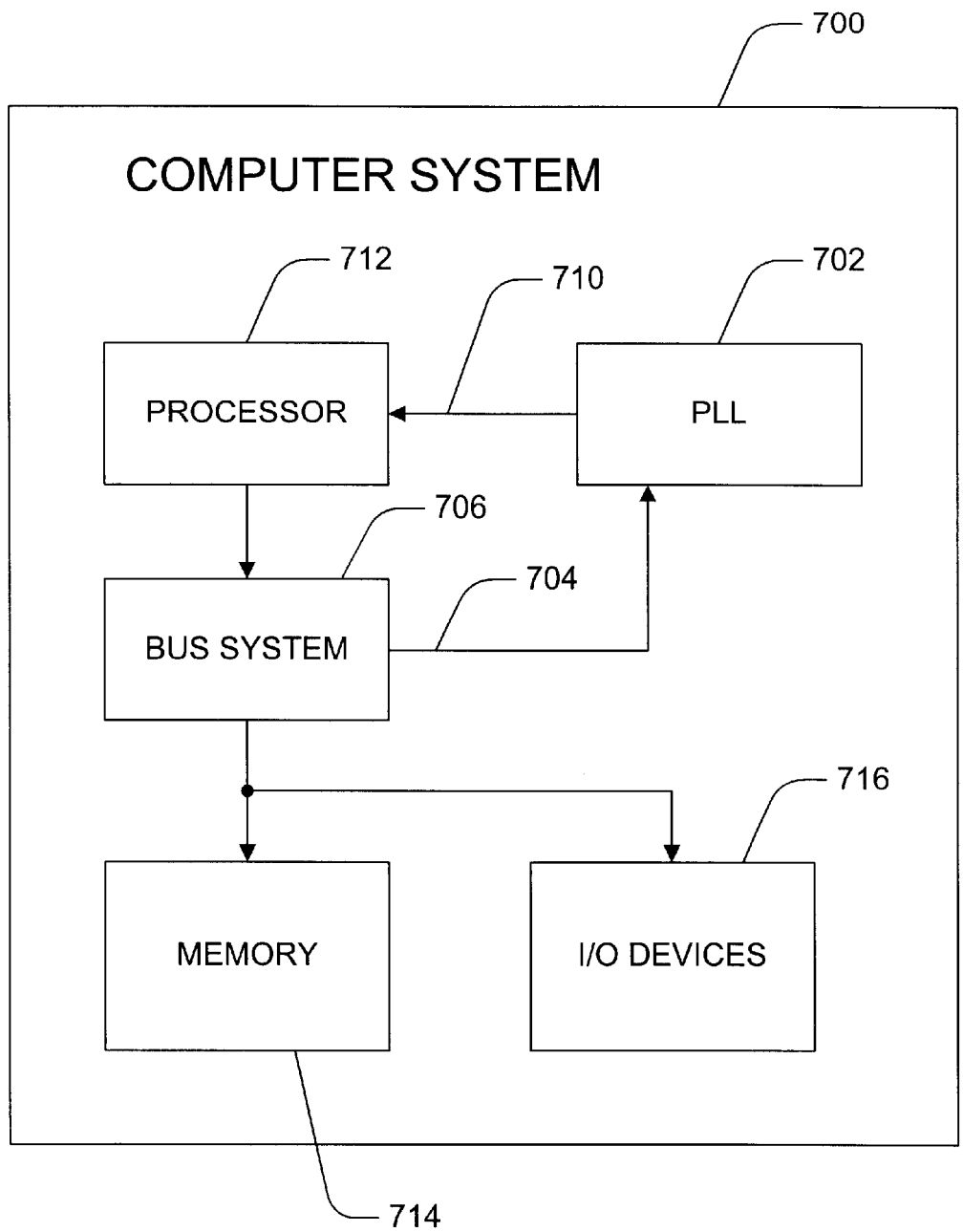
FIG. 7 is a block diagram of a computer system having an adaptive integrated PLL loop filter.

FIG. 7 is a block diagram of a computer system 700. In one embodiment, the computer system 700 includes a PLL 702 having an adaptive integrated loop filter 600. The PLL 702 receives a bus clock 704 from a bus system 706. A phase detector in the PLL 702 compares the bus clock signal 704 with a feedback frequency from the VCO. The feedback frequency locks the output of the VCO to the exact multiple frequency of the bus clock 704.

The output of the PLL 710 is used as a clock source for a processor 712. The processor 712 is then able to interface with other components of the computer system 700, such as a memory 714 and I/O devices 716. Synchronized clocks in the processor 712 and the bus system 706 enable data in the processor 712, the memory 714, and the I/O devices 716 to be transferred and shared across the bus system 706 with minimal data latency or data loss.

Other embodiments are within the scope of the following claims. For example, the gain amplifier 602 can be configured as a multistage amplifier having a plurality of op-amps. The amplifier gain can be controlled to provide an optimal effective capacitance value for the loop filter capacitor. Further, PLLs can be used in applications other than the computer system described in FIG. 7. For example, they can be used in data communication systems, local area networks, and data storage applications.

What is claimed is:

1. A phase-locked loop circuit comprising:

a phase detector to measure a phase or frequency offset between two input signals, said phase detector generating output pulses corresponding to said phase or frequency offset;

a charge pump receiving said output pulses, said charge pump providing a charge signal corresponding to said output pulses; and a loop filter including:

a capacitor having a first capacitance, said capacitor configured to receive said charge signal, said capacitor providing an output signal, an amplifier to receive said output signal and a gain control signal that makes an amplifier gain of said amplifier controllable, said gain control signal increasing said first capacitance by adjusting said amplifier gain; and a voltage-controlled oscillator configured to adjust its output frequency in response to said amplified control voltage.

2. The circuit of claim 1, further comprising:

a resistor in said loop filter, said resistor coupled to said amplifier, said resistor, in conjunction with said capacitor, filtering said charge signal.

3. The circuit of claim 1, further comprising;

a gain control element in said loop filter, said gain control element providing said control signal.

4. The circuit of claim 3, wherein said amplifier gain is adjusted to less than one.

5. A computer system comprising:

a processor;

a memory configured to store data;

input/output (I/O) devices to send and receive data from the processor and the memory;

a bus system coupled to said processor, memory, and I/O devices, said bus system facilitating transfer of data between these devices; and a phase-locked loop coupled to said processor and said bus system, said phase-locked loop providing clocks to enable data synchronization, said phase-locked loop including a loop filter having a capacitor having a first capacitance, said capacitor configured to receive said charge signal, said capacitor providing an output signal, and an amplifier to receive said output signal and a gain control signal that makes an amplifier gain of said amplifier controllable, said gain control signal increasing said first capacitance by adjusting said amplifier gain.

6. The system of claim 5, wherein gain of said amplifier is adjustable to less than one.

* * * * *